United States Patent
Mizuno

(10) Patent No.: US 10,727,071 B2
(45) Date of Patent: Jul. 28, 2020

(54) METHOD OF ANALYZING METAL CONTAMINATION OF SILICON WAFER AND METHOD OF MANUFACTURING SILICON WAFER

(71) Applicant: SUMCO CORPORATION, Tokyo (JP)

(72) Inventor: Taisuke Mizuno, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/485,243

(22) PCT Filed: Feb. 23, 2018

(86) PCT No.: PCT/JP2018/006599
§ 371 (c)(1),
(2) Date: Aug. 12, 2019

(87) PCT Pub. No.: WO2018/193714
PCT Pub. Date: Oct. 25, 2018

(65) Prior Publication Data
US 2019/0371616 A1 Dec. 5, 2019

(30) Foreign Application Priority Data
Apr. 17, 2017 (JP) .................................. 2017-081105

(51) Int. Cl.
*H01L 21/306* (2006.01)
*H01L 21/02* (2006.01)

(52) U.S. Cl.
CPC .. *H01L 21/30621* (2013.01); *H01L 21/02019* (2013.01)

(58) Field of Classification Search
CPC ................. H01L 21/30621; H01L 21/02019
See application file for complete search history.

(56) References Cited

U.S. PATENT DOCUMENTS 6,053,984 A 4/2000 Petvai et al.
2013/0244349 A1* 9/2013 Yamada .................. H01L 22/12
438/14

FOREIGN PATENT DOCUMENTS

JP 2002-040009 2/2002
JP 2008-130696 6/2008
(Continued)

OTHER PUBLICATIONS

International Search Report issued in International Patent Application No. PCT/JP2018/006599, dated Apr. 24, 2018.
(Continued)

*Primary Examiner* — Roberts P Culbert
(74) *Attorney, Agent, or Firm* — Greenblum & Bernstein, P.L.C.

(57) ABSTRACT

Provided is a method of analyzing metal contamination of a silicon wafer, the method including etching a surface layer region of the silicon wafer by bringing a surface of a silicon wafer to be analyzed into contact with etching gas that includes hydrogen fluoride gas and nitric acid gas; bringing an exposed surface of the silicon wafer, exposed by the etching, into contact with gas generated from a mixed acid including hydrochloric acid and nitric acid; heating the silicon wafer that has been brought into contact with the gas generated from the mixed acid; bringing the exposed surface, exposed by the etching, of the silicon wafer after the heating into contact with a recovery solution; and analyzing a metal component in the recovery solution that has been brought into contact with the exposed surface, exposed by the etching, of the silicon wafer.

19 Claims, 1 Drawing Sheet

(56) References Cited

FOREIGN PATENT DOCUMENTS

| JP | 2012-69855 | 4/2012 |
|----|------------|--------|
| JP | 2012-174964 | 9/2012 |
| TW | 201633416 | 9/2016 |
| WO | 2011/083719 | 7/2011 |

OTHER PUBLICATIONS

International Preliminary Report on Patentability (IPRP) for International Patent Application No. PCT/JP2018/006599, dated Oct. 22, 2019; and English-language translation thereof.
Office Action issued in Taiwanese Patent Appl. No. 107105973, dated May 3, 2019.

* cited by examiner

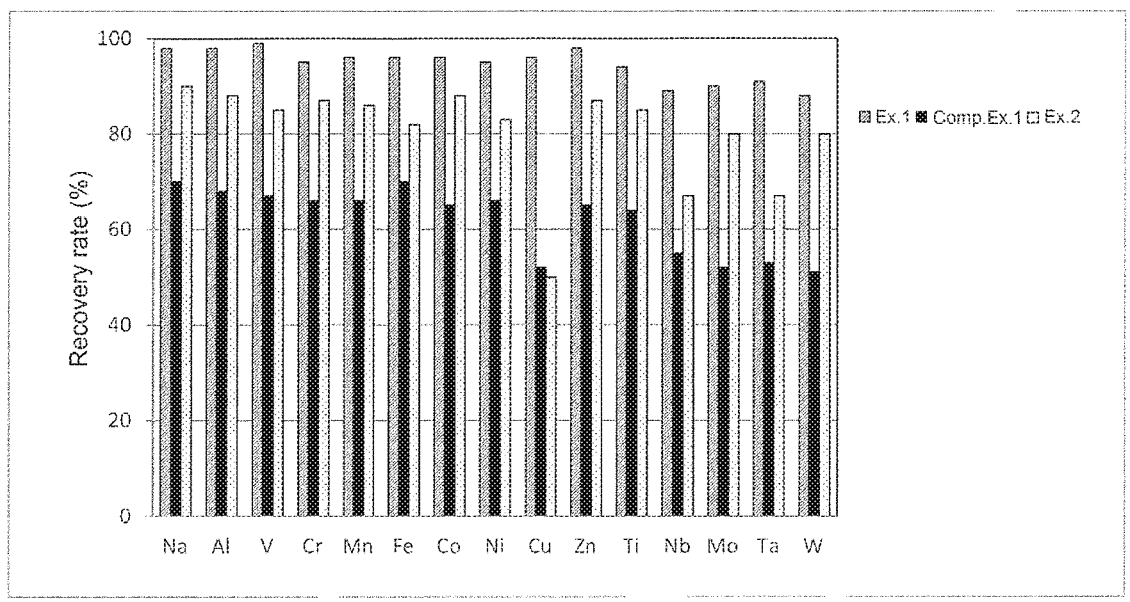

METHOD OF ANALYZING METAL CONTAMINATION OF SILICON WAFER AND METHOD OF MANUFACTURING SILICON WAFER

CROSS-REFERENCE TO RELATED APPLICATIONS

This application claims the benefit of priority to Japanese Patent Application No. 2017-81105 filed on Apr. 17, 2017, which is expressly incorporated herein by reference in its entirety.

TECHNICAL FIELD

The present invention relates to a method of analyzing metal contamination of a silicon wafer and a method of manufacturing a silicon wafer.

BACKGROUND ART

A silicon wafer has been widely used as a substrate of a semiconductor device. In a semiconductor device, the metal contamination of a substrate leads to reduction of the device performances. This entails a demand for a silicon wafer with less metal contamination. In order to provide a silicon wafer with less metal contamination, it is desirable to analyze the metal contamination of a silicon wafer, to perform quality determination based on the analysis results, and to perform a treatment for reducing the metal contamination in the silicon wafer manufacturing steps based on the analysis results, if required.

The analysis of the metal contamination of a silicon wafer can be performed by, for example, decomposing (etching) the silicon wafer surface layer region and analyzing the metal components in the decomposed residues. Examples of known decomposing methods include a method including bringing the silicon wafer surface into contact with a decomposing solution to dissolve and decompose the silicon wafer surface (liquid phase decomposition), and a method including bringing the silicon wafer surface to be decomposed into contact with etching gas to decompose the silicon wafer surface (vapor phase decomposition) (see, e.g., Japanese Patent Application Publication No. 2008-130696, which is expressly incorporated herein by reference in its entirety).

SUMMARY OF INVENTION

With the liquid phase decomposition, a large amount of a decomposing solution is required for uniformly etching a silicon wafer surface layer region. For this reason, the analysis sensitivity may be reduced by decrease in concentration of the metal components derived from the silicon wafer surface layer region due to dilution with a large amount of a decomposing solution. Further, the analysis sensitivity may be lowered by increase in decomposition background due to contamination originated from the decomposing solution itself. Therefore, as the decomposing method of the silicon wafer surface layer region, the vapor phase decomposition has been known as a more desirable method than the liquid phase decomposition in terms of the analysis sensitivity.

However, in recent years, with a trend toward fineness and higher integration of a semiconductor device, the demand for the metal contamination level reduction of a semiconductor substrate has become still more strict. For this reason, in order to detect even more trace amount of metal contamination, it is demanded to analyze the metal contamination of the silicon wafer with a still higher sensitivity than the analysis sensitivity implemented conventionally.

One aspect of the present invention provides for a new means enabling the improvement of the analysis sensitivity of the metal contamination analysis of a silicon wafer.

One aspect of the present invention relates to a method of analyzing metal contamination (also simply referred to as an "analysis method", hereinafter) of a silicon wafer, the method including:

etching a surface layer region of the silicon wafer by bringing a surface of a silicon wafer to be analyzed into contact with etching gas that includes hydrogen fluoride gas and nitric acid gas;

bringing an exposed surface of the silicon wafer, exposed by the etching, into contact with gas generated from a mixed acid including hydrochloric acid and nitric acid;

heating the silicon wafer that has been brought into contact with the gas generated from the mixed acid;

bringing the exposed surface, exposed by the etching, of the silicon wafer after the heating into contact with a recovery solution; and analyzing a metal component in the recovery solution that has been brought into contact with the exposed surface, exposed by the etching, of the silicon wafer.

The present inventor presumes the reason why the above analysis method enables to increase sensitivity of analysis of the metal contamination of a silicon wafer as follows.

With the above analysis method, the surface of the silicon wafer to be analyzed is brought into contact with the etching gas, to thereby etch the surface layer region of the silicon wafer. Namely, the silicon wafer surface layer region is etched by vapor phase decomposition. However, it has been generally known that Si compounds (Si residues) generate in the vapor phase decomposition reaction of silicon. Such Si compounds (Si residues) may hinder the metal components from being recovered into a recovery solution, or may become interfering substances in an analysis device for use in analysis of the metal components. The representative forming process of Si residues considered to be generated during the etching will be shown below.

    (1)

    (2)

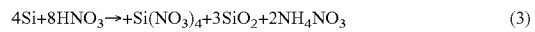    (3)

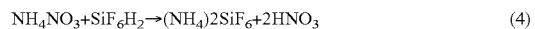    (4)

During etching, a reaction in which silicon is vaporized as $SiF_4$, as with the reactions (1) and (2), and a reaction in which a solid Si compound is generated as $(NH_4)2SiF_6$ as with the reactions (3) and (4) occur. When such Si compounds (Si residues) are recovered into the recovery solution and are introduced in a large amount into an analysis device to be used for metal component analysis, metal component analysis may be hindered, thereby entailing analysis sensitivity reduction.

In contrast, with the above analysis method, a surface layer region of the silicon wafer is first etched, and the exposed surface of the silicon wafer exposed by the etching is then brought into contact with the gas generated from a mixed acid including hydrochloric acid and nitric acid. In the mixed acid, the following reaction (5) is considered to proceed.

    (5)

Then, it is considered that the contact with the gas generated from the mixed acid would promote the reaction of dissolution of the Si residues on the silicon wafer surface. The present inventor presumes that the Si residues can be vaporized and removed by heating the silicon wafer thereafter.

On the other hand, claim 2 of Japanese Patent Application Publication No. 2008-130696 describes that the silicon wafer surface is heated after vapor phase decomposition. In contrast, the present inventor considers as follows: the silicon wafer is heated after being brought into contact with the gas generated from the mixed acid including hydrochloric acid and nitric acid; as a result, it becomes possible to improve the removal rate of the Si residues.

However, the above description includes presumptions by the present inventor. Such presumptions do not restrict the present invention at all.

In one embodiment, the heating of the silicon wafer that has been brought into contact with the gas generated from the mixed acid is heating the silicon wafer to a wafer surface temperature of 200° C. to 350° C.

In one embodiment, the above analysis method includes generating the etching gas from a solution including hydrofluoric acid, nitric acid, and a silicon piece.

In one embodiment, the above analysis method includes heating the above solution, to thereby promote generation of the above etching gas.

In one embodiment, the above heating includes heating the solution to a liquid temperature of 30° C. to 60° C.

In one embodiment, the above heating includes heating the solution to a liquid temperature of 30° C. to 50° C.

In one embodiment, the above analysis method includes heating the solution by a rubber heater attached to a sealed container including the above solution, and the silicon wafer to be analyzed, the silicon wafer being placed so as not to be in contact with the above solution.

Another aspect of the present invention relates to a method of manufacturing a silicon wafer, the method including:

preparing a silicon wafer lot including a plurality of silicon wafers;

analyzing metal contamination of at least one silicon wafer in the silicon wafer lot by the above analysis method; and subjecting, to preparation for shipment as a product silicon wafer, other one or more silicon wafers in the same lot as that of a silicon wafer with the metal contamination level judged as an allowable level as a result of the above analysis.

A still other aspect of the present invention relates to a method of manufacturing a silicon wafer, the method including:

manufacturing a silicon wafer in a manufacturing step to be evaluated;

analyzing metal contamination of the manufactured silicon wafer by the above analysis method; and manufacturing a silicon wafer in a manufacturing step in which a silicon wafer, with the metal contamination level judged as an allowable level as a result of the analysis, has been manufactured, or in the manufacturing step after performing a metal contamination reduction treatment additionally to a manufacturing step in which a silicon wafer, with the metal contamination level judged as exceeding the allowable level, has been manufactured.

In one embodiment, the manufacturing step to be evaluated includes a heat treatment furnace, wherein when the metal contamination level is judged as exceeding the allowable level as a result of the above analysis, the metal contamination reduction treatment is performed on the heat treatment furnace.

One aspect of the present invention can provide an analysis method of a silicon wafer capable of analyzing metal contamination of a silicon wafer with high sensitivity.

BRIEF DESCRIPTION OF DRAWINGS

FIG. 1 is a graph showing the recovery rates of various metal components in Examples 1 and 2, and Comparative Example 1.

DESCRIPTION OF EMBODIMENTS

[Analysis Method of Silicon Wafer]

One aspect of the present invention relates to a method of analyzing metal contamination of a silicon wafer, the method including: etching a surface layer region of the silicon wafer by bringing a surface of a silicon wafer to be analyzed into contact with etching gas that includes hydrogen fluoride gas and nitric acid gas; bringing an exposed surface of the silicon wafer, exposed by the etching, into contact with gas generated from a mixed acid including hydrochloric acid and nitric acid; heating the silicon wafer that has been brought into contact with the gas generated from the mixed acid; bringing the exposed surface, exposed by the etching, of the silicon wafer after the heating into contact with a recovery solution; and analyzing a metal component in the recovery solution that has been brought into contact with the exposed surface, exposed by the etching, of the silicon wafer.

The above analysis method will be further described below in details.

<Silicon Wafer to be Analyzed>

Examples of silicon wafers to be analyzed in the above analysis method may include wafers obtained by subjecting a silicon single crystal wafer (which may be either of a p type or an n type) to various treatments, for example, various silicon wafers such as a polished wafer, an annealed wafer, and an epitaxial wafer. The surface layer region of the silicon wafer to be etched means a partial region from the surface of the silicon wafer toward the depth direction. With general metal contamination analysis of a silicon wafer, the region from the silicon wafer surface to a depth in the thickness direction of about 0.02 to 10 μm often becomes a region to be analyzed. Therefore, in one example, the thickness of the surface layer region to be etched may be about 0.02 to 10 μm. However, the thickness of the surface layer region may depart from this range and may be set according to the analysis purpose. Alternatively, the surface layer region of the silicon wafer may be, in one embodiment, a layer positioned at the surface layer of the silicon wafer such as an epitaxial layer or an oxide film, or a part of such a layer or a part including such a layer.

<Etching of Silicon Wafer Surface Layer Region>

With the above analysis method, etching the silicon wafer surface layer region is performed by vapor phase decomposition. The etching gas for use in etching with the vapor phase decomposition includes hydrogen fluoride (HF) gas and nitric acid ($HNO_3$) gas. The etching gas including the gases can be, in one embodiment, generated from a solution (preferably an aqueous solution) including hydrofluoric acid (aqueous solution of hydrogen fluoride) and nitric acid. For example, the solution can be an aqueous solution obtained by mixing 40 to 50 mass % hydrofluoric acid and 50 to 70 mass % aqueous solution of nitric acid at a ratio of (the former):(the latter)=9:1 to 7:3 in a volume-based mixing ratio. The solution may include, or may not include an acid component other than hydrofluoric acid and nitric acid, and preferably does not include the acid component from the viewpoint of improving the generation efficiency of a hydrogen fluoride gas and a nitric acid gas. Further, the solution can include a silicon piece in one embodiment. The silicon piece can be a silicon piece obtained by, for example, cutting a product silicon wafer, or the like. The use amount of the silicon piece has no particular restriction. When at least a part of the silicon piece is dissolved in the solution, nitrogen oxides (such as NO, $NO_2$ and the like) are generated. The nitrogen oxide can exert a catalytic action on the reaction (1). This can conceivably promote the reaction.

The generation of the etching gas from the solution can be promoted by heating the solution. The promotion of generation of the etching gas is preferable for carrying out etching in a short time. The solution can be heated by, for example, attaching a heater to a container containing the solution. Specific embodiment of heating will be described later.

Alternatively, in another embodiment, etching gas including a hydrogen fluoride gas and a nitric acid gas can also be generated by mixing the mixed acid A and the mixed acid B described in Japanese Patent Application Publication No. 2012-69855. As for the details of such an embodiment, reference can be made to the description of paragraphs [0013] to [0020] of Japanese Patent Application Publication No. 2012-69855 and examples of the same publication.

The silicon wafer to be analyzed can preferably be etched in a sealed container. In the present invention and the present description, the term "sealed" regarding the sealed container is not necessarily limited to the meaning that the gas in the sealed container being fully prevented from leaking outside the sealed container, and is to be understood to mean that leakage of gas in a trace amount to the extent usually possible in the relevant field is allowable. For example, in an embodiment in which etching gas including hydrogen fluoride gas and nitric acid gas is generated from a solution including hydrofluoric acid and nitric acid, and preferably further including a silicon piece, in a sealed container containing the solution, and a silicon wafer to be analyzed, the silicon wafer being placed so as not be in contact with the solution, the etching gas is generated from the solution, and is brought into contact with the silicon wafer surface. As a result, the silicon wafer surface layer region can be etched. For example, when the silicon wafer is placed with the surface to be in contact with the etching gas facing upward on a silicon wafer mounting table in a sealed container, the solution and the silicon wafer can be put in a non-contact state. Herein, for example, a rubber heater may be attached to the sealed container for heating the solution. The set temperature of the rubber heater is preferably set within the range of 50° C. to 80° C. As a result, the liquid temperature of the solution in the sealed container can be set within the range of 30° C. to 60° C. The set temperature of the rubber heater is more preferably within the range of 50° C. to 70° C. As a result, the solution in the sealed container can be heated to a liquid temperature within the range of 30° C. to 50° C.

The contact time of the surface of the silicon wafer to be analyzed with the etching gas (also referred to as the "etching time", hereinafter) is preferably set at the time enabling etching of the objective thickness according to the thickness of the surface layer region to be analyzed. The etching time can be set at, for example, 5 to 60 minutes, preferably set at 20 to 45 minutes, and more preferably set at 25 to 35 minutes. The use amount of the solution for generating etching gas may be properly set at the amount enabling generation of the etching gas during a desirable etching time.

<Contact of Exposed Surface Exposed by Etching with Gas>

After etching as described above, the exposed surface of the silicon wafer exposed by etching is brought into contact with gas generated from a mixed acid including hydrochloric acid and nitric acid. As described previously, the gas is considered to include nitrosyl chloride (NOCl), chlorine, and NO. The present inventor considers that inclusion of nitrosyl chloride, which has a strong oxidizing power, among these leads to removal of the Si residues.

The mixed acid can be an aqueous solution obtained by, for example, mixing a 20 to 37 mass % aqueous solution of hydrochloric acid and a 50 to 70 mass % aqueous solution of nitric acid at a ratio of (the former):(the latter)=3:1 to 1:1 in a volume-based mixing ratio. Alternatively, the mixed acid may be a mixed acid of concentrated hydrochloric acid and concentrated nitric acid generally called aqua regia. The mixed acid may include or may not include other acid components than hydrochloric acid and nitric acid, and preferably does not include the other acid components from the viewpoint of further removing the Si residues.

The contact of the gas generated from the mixed acid with the exposed surface of the silicon wafer exposed by etching can be performed, for example, in the sealed container containing the mixed acid, and the silicon wafer to be analyzed, the silicon wafer being placed so as not to be in contact with the mixed acid as previously described regarding etching. The mixed acid can generate gas without temperature control such as heating or cooling. The contact time of the gas generated from the mixed acid with the exposed surface of the silicon wafer exposed by etching can be, for example, for 5 to 30 minutes, and is preferably for 10 to 30 minutes from the viewpoint of further removing the Si residues.

<Heating of Silicon Wafer>

The silicon wafer that has been brought into contact with the gas generated from the mixed acid is heated. Conceivably, contact of the Si residues with the gas dissolves the Si residues, followed by vaporization by heating; as a result, the Si residues can be removed from the silicon wafer surface. The present inventor presumes that this can reduce the Si-residue amount, leading to the analysis sensitivity improvement.

Heating the silicon wafer can be performed by, for example, placing the silicon wafer with the exposed surface exposed by etching facing upward on a hot plate. Heating the silicon wafer is preferably performed so that the surface temperature of the silicon wafer becomes 200° C. to 350° C. Further, the heating time can be, for example, for 5 to 60 minutes, and preferably be for 10 to 30 minutes.

The metal components included in the surface layer region removed by etching remains on the silicon wafer surface after the etching. Therefore, by recovering the metal components from the silicon wafer exposed surface exposed by etching for analysis after etching, it is possible to perform qualitative analysis and/or quantitative analysis of the metal components included in the silicon wafer surface layer region. However, it is known that the Si residues are also present in the silicon wafer exposed surface exposed by etching after etching, as previously described. The Si residues may hinder the metal components from being recovered into the recovery solution or may reduce of the analysis sensitivity of an analysis device. In contrast, the present inventor considers that, as described above, contact with the gas generated from the mixed acid and heating are performed, and as a result, the Si residues can be removed, thereby reducing the Si-residue amount. Recovery of the metal components will be described later.

<Contact of Silicon Wafer Surface after Heating with Recovery Solution>

With the above analysis method, the surface of the silicon wafer after the heating is brought into contact with the recovery solution. As a result, the metal components included in the silicon wafer surface layer region removed by etching can be taken into the recovery solution and can be recovered from the silicon wafer surface. As the recovery solution, a recovery solution known as a recovery solution for recovering metal components from the silicon wafer surface can be used. Examples of such recovery solutions may include pure water, a mixed solution of hydrofluoric acid and a hydrogen peroxide solution, a mixed solution of hydrogen peroxide and hydrochloric acid, and a mixed solution of hydrofluoric acid, a hydrogen peroxide solution, and hydrochloric acid. In the case using a recovery solution including an acid component, any known technical knowledge is applicable for selecting the concentration of the acid component without any restriction. Further, the use amount of the recovery solution may be determined in consideration of the size of the silicon wafer to be analyzed, and the like. For example, the wafer is tilted and rotated manually or automatically so that the recovery solution dropped on the silicon wafer surface is applied smoothly entirely over the silicon wafer surface. As a result, the recovery solution can rinse the whole silicon wafer surface. The silicon wafer before contact with the recovery solution may be subjected to a treatment for removing a natural oxide film from the silicon wafer surface. Removal of the natural oxide film can be performed by, for example, exposing the silicon wafer surface to a hydrogen fluoride gas or the like.

<Analysis of Metal Component>

The recovery solution incorporates therein the metal components included in the silicon wafer surface layer region removed by etching. Therefore, by analyzing the metal components in the recovery solution, it is possible to perform the qualitative analysis and/or quantitative analysis of the metal components included in the silicon wafer surface layer region removed by etching. Analysis of the metal components can be performed by analysis devices known as devices for analyzing metal components such as Inductively Coupled Plasma Mass Spectrometry (ICP-MS) and Atomic Absorption Spectrometry (AAS). Conceivably, with the above analysis method, it is possible to reduce the amount of the Si residues which may become an interfering substance and may reduce the analysis sensitivity of an analysis device. The present inventor presumes that this leads to the analysis improvement. The recovery solution brought into contact with the silicon wafer surface can be introduced into the analysis device as it is, or after having been diluted or concentrated, if required.

[Manufacturing Method of Silicon Wafer]

One aspect of the present invention relates to a method of manufacturing a silicon wafer (referred to as "manufacturing method 1", hereinafter), the method including:

preparing a silicon wafer lot including a plurality of silicon wafers;

analyzing metal contamination of at least one silicon wafer in the silicon wafer lot by the above analysis method; and subjecting, to preparation for shipment as a product silicon wafer, other one or more silicon wafers in the same lot as that of a silicon wafer with the metal contamination level judged as an allowable level as a result of the analysis.

The manufacturing method 1 includes performing a lot sampling inspection and analyzing the sampled silicon wafer by the above analysis method. Then, when the metal contamination level of the sampled silicon wafer is judged as an allowable level as a result of the analysis, at least one silicon wafer included in the same lot as that of the silicon wafer is subjected to preparation for shipment as a product silicon wafer. On the contrary, when the metal contamination level is judged as exceeding the allowable level, the silicon wafer is not shipped as a product, or otherwise, is subjected to a step for reducing the metal contamination, and then can be subjected to preparation for shipment as a product silicon wafer. Thus, it becomes possible to stably supply a high-quality silicon wafer with less metal contamination. As the preparation for shipment as a product silicon wafer, for example, cleaning before shipment or packing can be exemplified.

In the manufacturing method 1, a criterion for judging whether the metal contamination level of the sampled and analyzed silicon wafer is at the allowable level or exceeds the allowable level may be set according to the quality required of the product silicon wafer. The metal contamination level can be judged as the allowable level by the following facts: for example, the quantitative value of one or two or more specific metal components was equal to or less than a prescribed value; the total of the quantitative values of the metal components was equal to or less than a prescribed value; and a specific metal component was not detected by an analysis device (was detected in an amount equal to or less than the detection limit). In contrast, the metal contamination level can be judged as exceeding the allowable level by the following facts: for example, the quantitative value of one or two or more specific metal components exceeded a prescribed value; the total of the quantitative values of the metal components exceeded a prescribed value; and a specific metal component was detected by the analysis device (quantified in an amount of exceeding the detection limit). Further, the silicon wafer to be sampled may be one or more silicon wafers in the lot, or may be two or more thereof, and the number of the silicon wafers to be sampled has no particular restriction.

Further, another aspect of the present invention relates to a method of manufacturing a silicon wafer (referred to as "manufacturing method 2", hereinafter), the method including:

manufacturing a silicon wafer in a manufacturing step to be evaluated;

analyzing metal contamination of the manufactured silicon wafer by the above analysis method; and manufacturing a silicon wafer in a manufacturing step in which a silicon wafer with the metal contamination level judged as an allowable level as a result of the analysis has been manufactured, or in the manufacturing step after performing a metal contamination reduction treatment additionally to a manufacturing step in which a silicon wafer with the metal contamination level judged as exceeding the allowable level has been manufactured.

The manufacturing method 2 includes analyzing the silicon wafer manufactured in the manufacturing step to be evaluated by the above analysis method. Then, when the metal contamination level of the silicon wafer analyzed is judged as the allowable level as a result of the analysis, the manufacturing step of the silicon wafer to be evaluated is judged as causing less metal contamination. Thus, silicon wafers are manufactured in this manufacturing step. The manufactured silicon wafers can be shipped as product silicon wafers. Alternatively, in another embodiment, the silicon wafer lot manufactured in such a manufacturing step may be subjected to the manufacturing method 1.

On the other hand, when the metal contamination level of the silicon wafer that has been manufactured in the manufacturing step and is to be evaluated is judged as exceeding the allowable level as a result of the analysis, the manufacturing step to be evaluated is judged as tending to cause metal contamination of the silicon wafer. Thus, the manufacturing step is subjected to a metal contamination reduction treatment. Then, in the manufacturing step after performing the metal contamination reduction treatment, silicon wafers are manufactured. The manufactured silicon wafers can be, in one embodiment, shipped as product silicon wafers. Alternatively, in another embodiment, the silicon wafer manufactured in the manufacturing step after the metal contamination reduction treatment is subjected to metal contamination analysis by the above analysis method. If required, the metal contamination reduction treatment can also be performed based on the analysis results. Alternatively, in a still other embodiment, the silicon wafer lot manufactured in the manufacturing step after the metal contamination reduction treatment may be subjected to the manufacturing method 1. Namely, it is also possible to optionally combine the manufacturing method 1 and the manufacturing method 2.

In the manufacturing method 2, the criterion for judging whether the metal contamination level of the analyzed silicon wafer is at the allowable level or exceeds the allowable level is as described previously. Further, also in the manufacturing method 2, as described regarding the manufacturing method 1, the number of silicon wafers to be analyzed by the analysis method is at least one, and may be two or more, and has no particular restriction.

The manufacturing step of the silicon wafer to be evaluated can be a step known as the manufacturing step of a silicon wafer and has no particular restriction. Examples thereof may include a manufacturing step of subjecting a silicon wafer cut out from a silicon single crystal ingot to various grinding and/or polishing treatments, and manufacturing a polished wafer, a manufacturing step of an annealed wafer further including an annealing treatment, and a manufacturing step of an epitaxial wafer including an epitaxial layer forming treatment (epitaxial growth). Examples of the metal contamination reduction treatment to be performed in the manufacturing step of a silicon wafer may include exchange, washing, repairing, and the like of members, piping, devices, and the like included in the manufacturing steps, exchange, enhancement of purity, and the like of the chemical for use in the manufacturing steps, and enhancement of purity of the process gas. In one embodiment, the metal contamination of the silicon wafer can be generated by diffusion of the metal components deposited on the silicon wafer surface into the inside of the silicon wafer by heating in the heat treatment performed in the heat treatment furnace. In such a case, by subjecting the heat treatment furnace to the metal contamination reduction treatment, it becomes possible to manufacture a silicon wafer with metal contamination reduced after the metal contamination reduction treatment. The "heat treatment" in the present invention and the present description includes various heat treatments such as an annealing treatment, an epitaxial layer formation treatment, and an oxide film formation treatment.

EXAMPLES

The present invention will be further described below by way of examples. However, the present invention is not limited to the embodiments demonstrated in the examples. The operations described below were performed at room temperature and under atmospheric pressure unless otherwise specified.

Example 1

(1) Etching of Silicon Wafer Surface Layer Region

On one surface of a clean silicon wafer with a diameter of 300 mm, 0.1 ml of a solution including various metal elements each in a concentration of 10 ppb (on a mass basis) was dropped. As a result, a silicon wafer with the surface intentionally metal-contaminated was prepared. In the present section (1), the intentionally metal-contaminated surface is simply referred to as the surface.

To a container for performing etching, a solution obtained by adding 0.1 g of a silicon piece to 1000 ml of a mixed acid prepared by mixing 50 mass % hydrofluoric acid and a 68 mass % aqueous solution of nitric acid at a ratio of (the former):(the latter) (on a volume basis)=9:1 was introduced.

The silicon wafer was placed on a wafer mounting table in the container with the surface facing upward so as not to be in contact with the solution. Then, the container was sealed by a lid, and in the sealed container, the surface of the silicon wafer was brought into contact with etching gas including a hydrogen fluoride gas and a nitric acid gas generated from the solution for 30 minutes. As a result, the surface layer region on the surface side was etched. During etching, the container was heated by a rubber heater (set temperature of 65° C.), thereby heating the solution to a liquid temperature of 50° C. The thickness of the etched surface layer region was about 5 μm.

(2) Contact of Exposed Surface Exposed by Etching with Gas

Into a different container from the container used in the step (1), 600 ml of a mixed acid obtained by mixing a 37 mass % aqueous solution of hydrochloric acid and a 68 mass % aqueous solution of nitric acid at ratio of 1:1 (on a volume basis) was introduced.

The silicon wafer after the etching of the step (1) was placed on a wafer mounting table in the container with the exposed surface exposed by etching facing upward so as not to be in contact with the mixed acid. Then, the container was sealed by a lid. Thus, the exposed surface of the silicon wafer exposed by the etching was brought into contact with the gas generated from the mixed acid in the sealed container for 15 minutes.

(3) Heating of Silicon Wafer

The silicon wafer after contact with the gas generated from the mixed acid was mounted with the exposed surface exposed by etching facing upward on a hot plate, and was heated for 15 minutes (the surface temperature of the silicon wafer during heating: 250° C.).

(4) Contact of Silicon Wafer Surface after Heating with Recovery Solution, Analysis of Metal Components After the heating, the silicon wafer exposed surface exposed by etching was exposed to a hydrogen fluoride gas in order to remove the natural oxide film. Then, the whole surface was rinsed with 1 ml of the recovery solution in order to recover the metal components from the surface. As the recovery solution, a mixed solution of 2 mass % hydrofluoric acid and 2 mass % $H_2O_2$ was used.

Subsequently, the recovery solution after rinsing was introduced to an ICP-MS, thereby performing quantitative analyses of various metal components.

Example 2

The same operation was performed as that of Example 1, except for setting the contact time (etching time) with the etching gas at the step (1) at 45 minutes, and setting the set temperature of the rubber heater at 80° C. to heat the solution to a liquid temperature of 60° C. The thickness of the etched surface layer region was about 10 μm.

Comparative Example 1

The same operation was performed as that of Example 1, except for not conducting contact of the exposed surface exposed by etching in the step (2) with the gas.

The recovery rates of respective metal components were calculated from the quantitative values and the intentional contamination amounts of various metal components obtained for Examples 1 and 2, and Comparative Example 1. The graph of the calculated recovery rates is illustrated in FIG. 1. Further, the average values of the recovery rates of the metal components illustrated in FIG. 1 are listed in Table 1 below. These results mean that the higher the recovery rate of each metal component is, the higher the analysis sensitivity for the metal component is.

TABLE 1

|  | Example 1 | Example 2 | Comparative Example 1 |
|---|---|---|---|
| Metal component recovery rate average value | 95% | 80% | 62% |

In Examples 1 and 2, as compared with Comparative Example 1, the recovery rate of the metal component was higher, and it was possible to analyze various metal components with higher sensitivity. This is considered due to the fact that by heating the silicon wafer after bringing the exposed surface exposed after etching into contact with the gas generated from the mixed acid including hydrochloric acid and nitric acid, the Si residues were vaporized and removed.

Further, comparison between Examples 1 and 2 indicates that, in Example 1, it was possible to analyze various metal components with higher sensitivity. In Example 1, heating for promoting the generation of the etching gas was performed at a lower temperature than in Example 2; and the etching time was shorter than in Example 2. As a result, the smoothness of the silicon wafer exposed surface exposed by etching was higher than in Example 2. Conceivably, this contributes to the increase in recovery rate of the metal components from the surface.

For example, by carrying out the manufacturing method 1 and/or the manufacturing method 2 described previously using the analysis method of the examples, it is possible to stably supply a high-quality silicon wafer with less metal contamination.

For the recovery solution obtained by performing the same operation as that in Example 1 (the contact time with the gas after etching being 15 minutes), and the recovery solutions obtained by performing the same operation except for setting the contact time with the gas after etching at 5 minutes, 10 minutes, and 30 minutes, the Si amount in each recovery solution was measured using ICP-MS. As a result, the Si amount in each recovery solution was an amount as minute as about 10 to 70 ppm on a mass basis and was at the level not causing a concern about desensitization of ICP-MS and the effect of the Si matrix. The reason why the Si amount in the recovery solution could be made minute is that contact with the gas after etching and the subsequent heating were performed, thereby removing the Si residues. When the contact time with the gas was 5 minutes, the residues looking like a trace amount of Si residues were visually observed on the silicon wafer surface after heating. However, when the contact times with the gas were 10 minutes, 15 minutes, and 30 minutes, such residues were not observed at all on each silicon wafer surface after heating.

In contrast, on the silicon wafer surface after performing the same operation as that in Comparative Example 1 (without contact with the gas after etching), the residues considered to be Si residues were visually observed in a film form.

One aspect of the present invention is useful in the technical field of a silicon wafer usable as a semiconductor substrate.

The invention claimed is:

1. A method of analyzing metal contamination of a silicon wafer,
   which comprises:
   etching a surface layer region of the silicon wafer by bringing a surface of a silicon wafer to be analyzed into contact with etching gas that comprises hydrogen fluoride gas and nitric acid gas;
   bringing an exposed surface of the silicon wafer, exposed by the etching, into contact with gas generated from a mixed acid comprising hydrochloric acid and nitric acid;
   heating the silicon wafer that has brought into contact with the gas generated from the mixed acid;
   bringing the exposed surface, exposed by the etching, of the silicon wafer after the heating into contact with a recovery solution; and
   analyzing a metal component in the recovery solution that has been brought into contact with the exposed surface, exposed by the etching, of the silicon wafer.

2. The method of analyzing metal contamination of a silicon wafer according to claim 1,
   wherein the heating of the silicon wafer that has been brought into contact with the gas generated from the mixed acid is heating the silicon wafer to a wafer surface temperature of 200° C. to 350° C.

3. The method of analyzing metal contamination of a silicon wafer according to claim 1,
   which comprises generating the etching gas from a solution comprising hydrofluoric acid, nitric acid, and a silicon piece.

4. The method of analyzing metal contamination of a silicon wafer according to claim 3,
   which comprises heating the solution, to thereby promote generation of the etching gas.

5. The method of analyzing metal contamination of a silicon wafer according to claim 4,
   which comprises heating the solution to a liquid temperature of 30° C. to 60° C.

6. The method of analyzing metal contamination of a silicon wafer according to claim 4,
   which comprises heating the solution to a liquid temperature of 30° C. to 50° C.

7. The method of analyzing metal contamination of a silicon wafer according to claim 4,
   which comprises conducting the heating of the solution by heating the solution by a rubber heater attached to a sealed container comprising the solution, and the silicon wafer to be analyzed, the silicon wafer being placed so as not to be in contact with the solution.

8. A method of manufacturing a silicon wafer,
   which comprises:

preparing a silicon wafer lot comprising a plurality of silicon wafers;

analyzing metal contamination of at least one silicon wafer in the silicon wafer lot by the method according to claim 1; and subjecting, to preparation for shipment as a product silicon wafer, other one or more silicon wafers in the same lot as that of a silicon wafer with the metal contamination level judged as an allowable level as a result of the analysis.

9. A method of manufacturing a silicon wafer, which comprises:

manufacturing a silicon wafer in a manufacturing step to be evaluated;

analyzing metal contamination of the manufactured silicon wafer by the method according to claim 1; and manufacturing a silicon wafer in a manufacturing step in which a silicon wafer, with the metal contamination level judged as an allowable level as a result of the analysis, has been manufactured, or in the manufacturing step after performing a metal contamination reduction treatment additionally to a manufacturing step in which a silicon wafer, with the metal contamination level judged as exceeding the allowable level, has been manufactured.

10. The method of manufacturing a silicon wafer according to claim 9, wherein the manufacturing step to be evaluated comprises a heat treatment furnace, and the metal contamination reduction treatment is performed on the heat treatment furnace when the metal contamination level is judged as exceeding the allowable level as a result of the analysis.

11. The method of analyzing metal contamination of a silicon wafer according to claim 5, which comprises conducting the heating of the solution by heating the solution by a rubber heater attached to a sealed container comprising the solution, and the silicon wafer to be analyzed, the silicon wafer being placed so as not to be in contact with the solution.

12. The method of analyzing metal contamination of a silicon wafer according to claim 6, which comprises conducting the heating of the solution by heating the solution by a rubber heater attached to a sealed container comprising the solution, and the silicon wafer to be analyzed, the silicon wafer being placed so as not to be in contact with the solution.

13. The method of analyzing metal contamination of a silicon wafer according to claim 2, which comprises generating the etching gas from a solution comprising hydrofluoric acid, nitric acid, and a silicon piece.

14. The method of analyzing metal contamination of a silicon wafer according to claim 13, which comprises heating the solution, to thereby promote generation of the etching gas.

15. The method of analyzing metal contamination of a silicon wafer according to claim 14, which comprises heating the solution to a liquid temperature of 30° C. to 60° C.

16. The method of analyzing metal contamination of a silicon wafer according to claim 14, which comprises heating the solution to a liquid temperature of 30° C. to 50° C.

17. The method of analyzing metal contamination of a silicon wafer according to claim 14, which comprises conducting the heating of the solution by heating the solution by a rubber heater attached to a sealed container comprising the solution, and the silicon wafer to be analyzed, the silicon wafer being placed so as not to be in contact with the solution.

18. The method of analyzing metal contamination of a silicon wafer according to claim 15, which comprises conducting the heating of the solution by heating the solution by a rubber heater attached to a sealed container comprising the solution, and the silicon wafer to be analyzed, the silicon wafer being placed so as not to be in contact with the solution.

19. The method of analyzing metal contamination of a silicon wafer according to claim 16, which comprises conducting the heating of the solution by heating the solution by a rubber heater attached to a sealed container comprising the solution, and the silicon wafer to be analyzed, the silicon wafer being placed so as not to be in contact with the solution.

* * * * *